United States Patent [19]

Thomas

[11] Patent Number: 4,628,341
[45] Date of Patent: Dec. 9, 1986

[54] INTEGRATED CIRCUIT STRUCTURE COMPRISING CMOS TRANSISTORS HAVING HIGH BLOCKING VOLTAGE CAPABILITY AND METHOD OF FABRICATION OF SAID STRUCTURE

[75] Inventor: Gilles Thomas, Le Fontanil, France

[73] Assignee: Thomson CSF, Paris, France

[21] Appl. No.: 780,980

[22] Filed: Sep. 27, 1985

[30] Foreign Application Priority Data

Sep. 28, 1984 [FR] France .................... 84 14988

[51] Int. Cl.$^4$ ............................................. H01L 27/02
[52] U.S. Cl. ...................................... 357/42; 357/23.4
[58] Field of Search .................... 357/23.4, 42

[56] References Cited

U.S. PATENT DOCUMENTS 4,325,180  4/1982  Curran .................... 357/23.4

Primary Examiner—Edward J. Wojciechowicz
Attorney, Agent, or Firm—Cushman, Darby & Cushman

[57] ABSTRACT

An integrated circuit structure includes both low-voltage n-channel and p-channel MOS transistors (LV-NMOS transistors and LV-PMOS transistors) and high-voltage n-channel and p-channel MOS transistors (HV-NMOS transistors and HV-PMOS transistors). There are formed at the same time first p$^-$ regions for the compartments of the LV-NMOS transistors, second p$^-$ regions in which only the sources and channels of the HV-NMOS transistors are incorporated, and third p$^-$ regions in which only the drains of the HV-PMOS transistors are incorporated.

2 Claims, 8 Drawing Figures

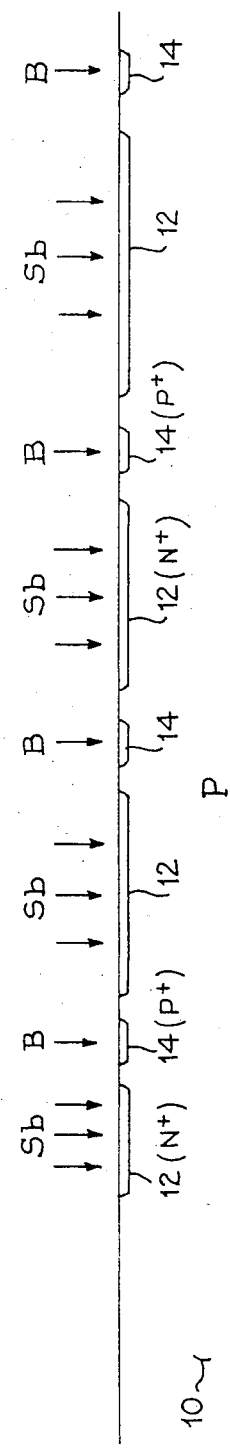
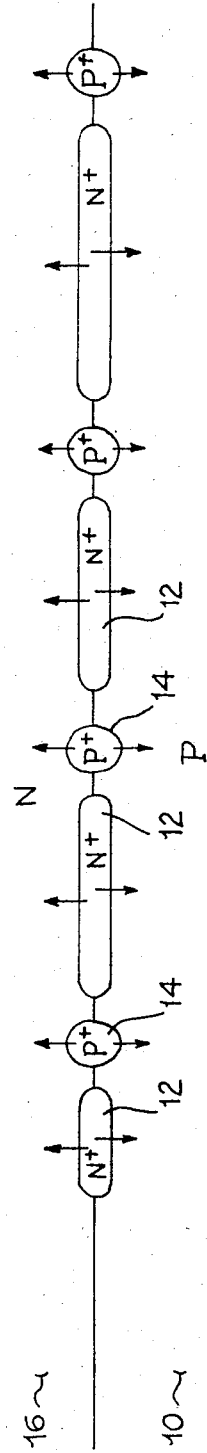
Fig.1
Fig.2

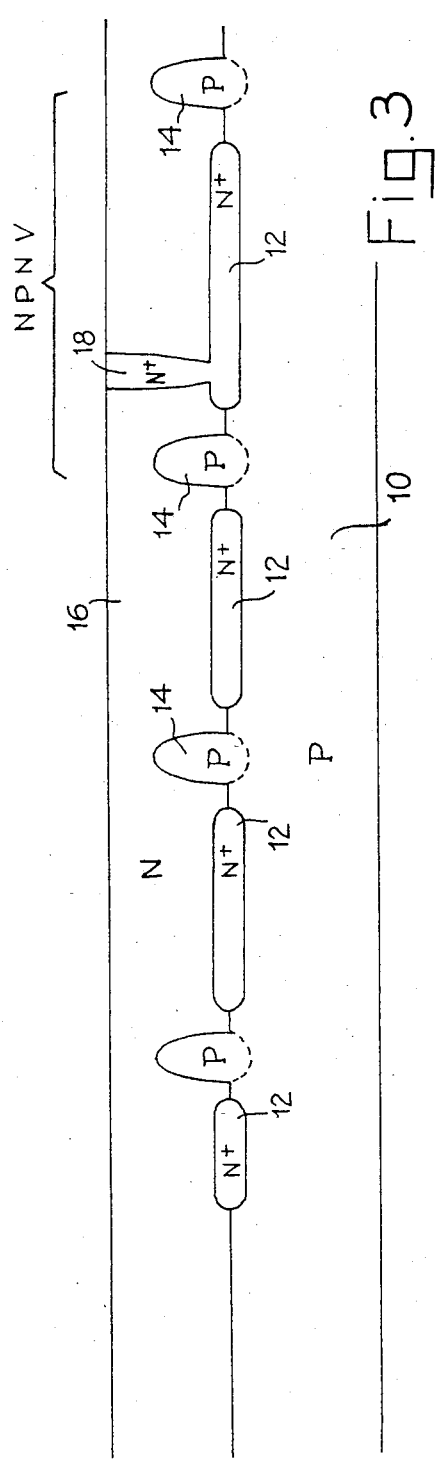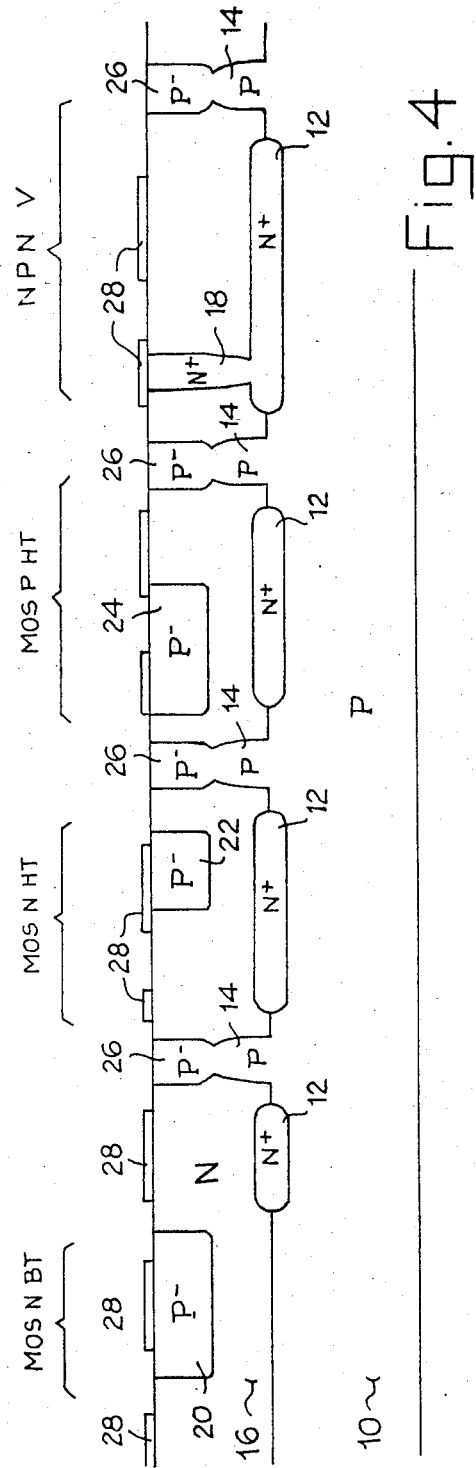

INTEGRATED CIRCUIT STRUCTURE COMPRISING CMOS TRANSISTORS HAVING HIGH BLOCKING VOLTAGE CAPABILITY AND METHOD OF FABRICATION OF SAID STRUCTURE

BACKGROUND OF THE INVENTION

1. Field of the Invention

The present invention relates to integrated circuits and more particularly to circuits constructed in accordance with a CMOS technology, that is to say in which both n-channel and p-channel MOS transistors are incorporated on a single semiconductor substrate.

2. Description of the Prior Art

The CMOS technology is employed in particular for the implementation of logic functions and makes it possible in particular to obtain circuits which have low power consumption and operate at a very low voltage (of the order of a few volts).

However, it is sometimes desired to obtain a much higher blocking voltage capability than is permitted by the normal CMOS technology. This is the case, for example, with output stages for controlling special devices such as visual display devices which are supplied at a voltage of the order of one hundred volts.

MOS transistors which have improved blocking voltage capability and are thus capable of meeting the above-mentioned requirement have already been proposed. These transistors have a drain region which is not immediately adjacent to the channel region (namely the region covered by the control gate) but is separated from said channel region by a region having the same conductivity type as the drain region and a much lower dopant concentration. This region is of relatively substantial width (several microns for example between the heavily doped drain region and the channel region) and serves to carry part of the applied voltage by permitting an extension of the space charge towards the drain, said space charge being developed when the transistor is in the non-conducting state.

In the few known instances in which it has been endeavored up to the present time to fabricate both CMOS logic transistors and high-voltage MOS transistors on a single semiconductor substrate, the structures proposed in all cases are attended by a disadvantage in that they call for a relatively large number of fabrication steps and a large number of different masks.

SUMMARY OF THE INVENTION

One object of the invention is to propose a structure and a method of formation of said structure which permits fabrication in a small number of steps and with a small number of masks, and in which (low-voltage) CMOS logic circuits and n-channel and p-channel high-voltage MOS transistors are incorporated in this structure.

A further object of the invention is to propose a structure incorporating CMOS logic transistors and high-voltage CMOS transistors, this structure being such that bipolar transistors can also be incorporated therein without modifying the method of fabrication. It is in fact highly desirable in an industrial manufacturing process to ensure that the process steps are as universal as possible so that a large number of products which are very different from each other can follow the same production line to a substantial extent. This is a desirable objective in the case of the structure now under consideration, even if these products incorporate elements as different as (low-voltage) CMOS logic transistors, high-voltage CMOS transistors and bipolar transistors.

The basic structure proposed herein for the formation of a circuit incorporating n-channel and p-channel MOS logic transistors and n-channel and p-channel high-voltage MOS transistors comprises:

a semiconductor wafer formed by a substrate covered with a lightly doped n-type epitaxial layer;

first lightly doped p$^-$ type regions extending from the surface of the semiconductor wafer to part of the depth of the epitaxial layer, these regions being such as to constitute compartments in which are formed the source, the drain and the channel of low-voltage n-channel MOS transistors;

heavily doped p$^+$ type regions which are of smaller depth than the lightly doped P$^-$ type regions, which extend from the surface of the semiconductor wafer, and which constitute the source and drain of the low-voltage or high-voltage p-channel MOS transistors;

heavily doped n$^+$ type regions which are of smaller depth than the p$^-$ type regions and extend from the surface of the semiconductor wafer so as to constitute the source and the drain of low-voltage or high-voltage n-channel MOS transistors;

at least a second p$^-$ type region having the same concentration profile as the first regions and extending to the same depth, said second region being adapted to surround an n$^+$ type source region and to constitute a channel region of an n-channel high-voltage MOS transistor which further comprises an n$^+$ type drain region located outside the second region and in spaced relation thereto so as to permit the existence of a lightly doped n-type epitaxial layer region not directly controlled by the transistor gate between the drain region and the second region;

at least a third p$^-$ type region having the same concentration profile as the first and second regions and extending to the same depth, said third region being adapted to surround a p$^+$ type drain region of a p-channel high-voltage MOS transistor in which the channel region is constituted by a lightly doped n-type epitaxial-layer region adjacent to the third region, the p$^+$ type drain region of said transistor being in spaced relation to the channel region so as to form between these latter a zone of the third region which is not directly controlled by the transistor gate, and the source region of said transistor being located outside said third region.

The most distinctive feature of this structure lies in the fact that both the n-channel and the p-channel high-voltage MOS transistors are fabricated from diffusions which are localized within a lightly doped epitaxial layer and are identical with the diffusion of the insulating compartments of the low-voltage n-channel MOS transistors. This structure is thus conducive to a very simple manufacturing process and permits extensions in particular to structures in which CMOS transistors and bipolar transistors are combined without entailing any need to change the general process involved in the treatment of integrated circuit wafers.

The method of fabrication in accordance with the invention is therefore characterized by the formation (implantation/diffusion) of p$^-$ type regions in a single step starting from the surface of the n-type epitaxial layer, not only at the points which are intended to form compartments enclosing all the n-channel MOS transistors (source+drain+channel) but also in regions within which the source alone (and not the drain) of n-channel MOS transistors or the drain alone (and not the source) of p-channel transistors will subsequently be diffused.

BRIEF DESCRIPTION OF THE DRAWINGS

Other features of the invention will be more apparent upon consideration of the following description and accompanying drawings, wherein:

FIGS. 1 to 7 illustrate the successive steps of the method of fabrication in accordance with the invention;

Figure 5:
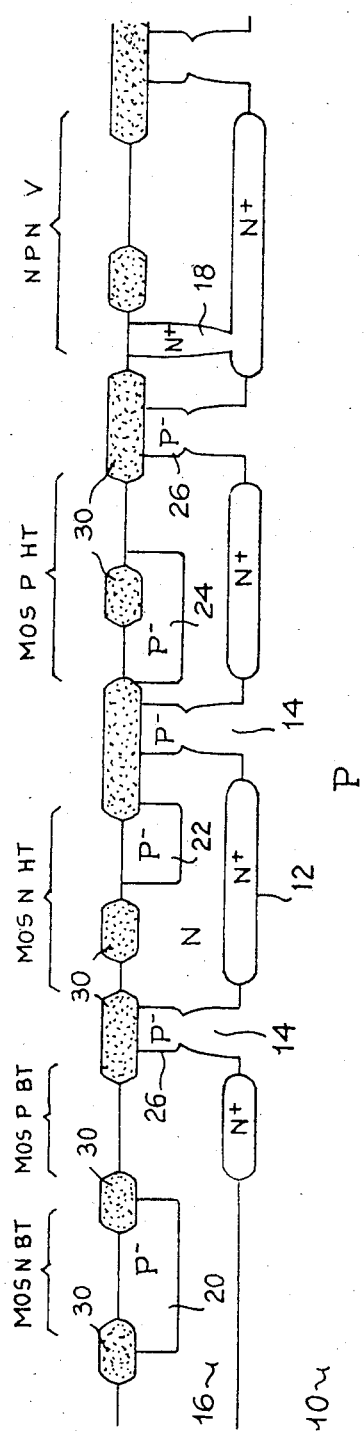

In order to achieve enhanced clarity of the drawings, the horizontal and vertical scales have not been observed.

DESCRIPTION OF THE PREFERRED EMBODIMENTS

In the example of construction which is illustrated, the starting material consists of p-type silicon 10 although it will be apparent that different substrates could be employed at the outset in some applications. By way of example, consideration could be given to a p/p+ substrate or in other words to a p-type substrate heavily doped only on its rear face (especially when it is desired to include in the circuit a vertical pnp bipolar power transistor having a collector which is accessible from the rear face). Another alternative example could consist of an n+ type substrate which is heavily doped throughout its thickness, for example if it is desired to form in the circuit a vertical npn bipolar power transistor so designed that the collector is accessible from the rear face of the substrate.

On the front face of the substrate (shown as the top face in the figures), there is carried out a first localized implantation of an n-type impurity (such as antimony, for example) having a high concentration so as to form locally n+ type regions 12 which will subsequently constitute so-called buried layers.

The implantation process is performed through a resin mask which is open only at the locations corresponding to the regions 12.

This n+ type implantation is subsequently followed by epitaxial growth of monocrystalline silicon on the entire top face of the substrate 10. However, in the example of construction which is more specifically described, the process is planned to include an additional step which arises from the fact that junction isolation zones are provided between the different active circuit zones, for example between the different MOS transistors in which the sources are not connected to the same potential. In more specific terms, isolation is achieved by means of p-type isolating walls which pass through the entire epitaxial layer from the surface down to the p-type substrate. These walls are formed by a double diffusion of p-type impurities, namely an upward diffusion from the substrate and a downward doping from the surface of the epitaxial layer. It is for this reason that, prior to the epitaxial growth step, a second ion implantation is carried out on the top surface of the substrate 10, this time with a p-type impurity (such as boron, for example), this implantation being localized by means of a resin mask, said mask being open at the points corresponding to the desired isolating wall. The structure of FIG. 1 is then obtained with n+ type regions 12 and p+ type regions 14 which are flush with the surface of the substrate.

A lightly doped n-type epitaxial layer 16 of monocrystalline silicon is then grown on the entire top surface of the substrate. During growth of this layer and also during certain subsequent heat treatment steps, the previously implanted impurities diffuse both towards the substrate 10 and towards the epitaxial layer 16 as indicated in FIG. 2.

The following figures show the buried-layer regions 12 placed astride the boundary between the initial p-type substrate and the epitaxial layer 16 which covers this latter. As far as the regions 14 are concerned, these regions are diffused on the one hand in the downward direction and reduce the influence of the parasitic lateral npn zone formed by the buried layers and on the other hand in the upward direction in which they form the lower portion of the future isolating walls.

In the example herein described, steps have been taken to provide the integrated circuit not only with field-effect transistors (MOSFETs) but also with a vertical npn bipolar transistor in which the collector current is collected by a portion of buried layer 12 located beneath said transistor. There is formed in this case a well 18 providing access to said buried layer. Said well is a heavily doped n+ type region which extends through the epitaxial layer 16 from its surface down to the buried layer. The best method of forming said access well accordingly consists in deep diffusion of phosphorus (pre-deposition of POCl₃) immediately after formation of the epitaxial layer 16. FIG. 3 illustrates the integrated circuit structure at this stage of the fabrication process.

The following step is a basic process step which consists in local formation of lightly doped p-type regions (which will hereinafter be designated as p⁻ regions). These regions extend from the surface of the epitaxial layer down to a fraction of the depth of this latter (for example to a depth of 7 to 8 microns in the case of an epitaxial layer having a thickness of 15 microns).

Localization of these regions is as follows:

(1) Should it be desired to provide in a predetermined location n-channel MOS transistors (LV-NMOS transistors) having a low blocking voltage capability, especially for the logic functions of the circuit, there is first formed a p⁻ region 20 constituting a closed compartment in which the entire n-channel MOS transistor (or even a plurality of transistors) comprising the complete assembly of source region, drain region and channel region, this latter being constituted by the surface portion of the p⁻ type region 20.

(2) Should it be desired to provide in a predetermined location n-channel MOS transistors (HV-NMOS transistors) having a high blocking voltage capability, for example for output stages, there is first formed a p⁻ region 22 within which there will subsequently be diffused for each transistor a single heavily-doped n+ region of smaller depth than the region 22 in order to form the source of the transistor, the channel being constituted by a portion of said region 22 (hence the need to provide the same threshold voltage for the HV-NMOS transistor and the LV-NMOS transistor).

(3) Should it be desired to provide p-channel high-voltage MOS transistors in a predetermined location, there is first formed a p⁻ region 24 within which there will subsequently be diffused for each transistor a single heavily-doped p+ type region of smaller depth than the region 24 so as to constitute the drain of the transistor, the channel being constituted by a portion of the n-type epitaxial layer 16.

(4) If the isolation between active zones is produced by junction (p-type isolating walls as in the case of the example described), a p⁻ region 26 will be formed at the level of said isolating walls or in other words directly above each diffused region 14, with the result that each region 14 is joined to a corresponding region 26 in order to complete the isolating wall which then extends through the entire thickness of the epitaxial layer 16.

These different p⁻ type regions are formed simultaneously by localized ion implantation (with a suitable masking resin deposited and etched so as to produce a pattern corresponding to the regions to be formed). The implanted impurity is preferably boron with a dose which can be of the order of $1.5 \times 10^{13}$ atoms/cm². This imlantation operation is followed by a thermal diffusion treatment for ensuring that the p⁻ regions attain a sufficient depth (essentially dictated by the height desired for the compartments which contain the n-channel MOS transistors). By way of example, the surface concentration of p-type impurities in the p⁻ regions becomes of the order of $10^{16}$ atoms/cm³ on completion of the diffusion process.

The following step consists in employing a conventional localized oxidation process for the purpose of forming thick silicon oxide regions which surround the active zones such as those which surround each MOS transistor.

The thick oxide regions just mentioned will serve in particular as supports for the metallic interconnections of the circuit.

To this end, a silicon nitride layer 28 is deposited and etched in order to remove it from a predetermined location in which the thick oxide is to be epitaxially grown. There is then performed an implantation of n-type impurities (arsenic) at predetermined locations defined by a resin mask, this being followed by a p-type implantation (of boron) at other locations defined by another resin mask. These so-called "edge" implantations which are subsequently located beneath the thick oxide are intended to guard against conduction of parasitic MOS transistors formed beneath the thick oxide. These implantations are conventional and have not been illustrated in order not to complicate the drawings unduly. FIG. 4 shows the integrated structure at this stage of the fabrication process.

An oxidizing heat treatment is then performed in order to produce a growth of thick oxide in nitride-free locations, whereupon the nitride is removed. It is worthy of note that diffusion of impurities implanted in the p⁻ regions (20, 22, 24, 26) takes place during this heat treatment.

FIG. 5 shows the state of the structure at the end of this process step with thick oxide zones 30 at different locations and more specifically at locations in which it is desired to prevent an interconnection of metal or of polycrystalline silicon from passing in the immediate vicinity of the semiconducting surface and thus inducing an undesirable channel (or inversion layer) by field effect.

For example, a thick oxide region 30 is particularly desirable between the drain region and the channel region of the high-voltage MOS transistors.

In regard to any bipolar transistors which may be present, provision can be made for a thick oxide region 30 which surrounds the access well 18 and the base region of these transistors.

The following process step consists in uniformly forming on all the surfaces which have been stripped of monocrystalline silicon, between the thick oxide regions 30, a thin layer of silicon oxide which is intended to form the gate oxide of the MOS transistors. This layer 32 is formed by thermal oxidation of the semiconductor wafer.

Figure 6:
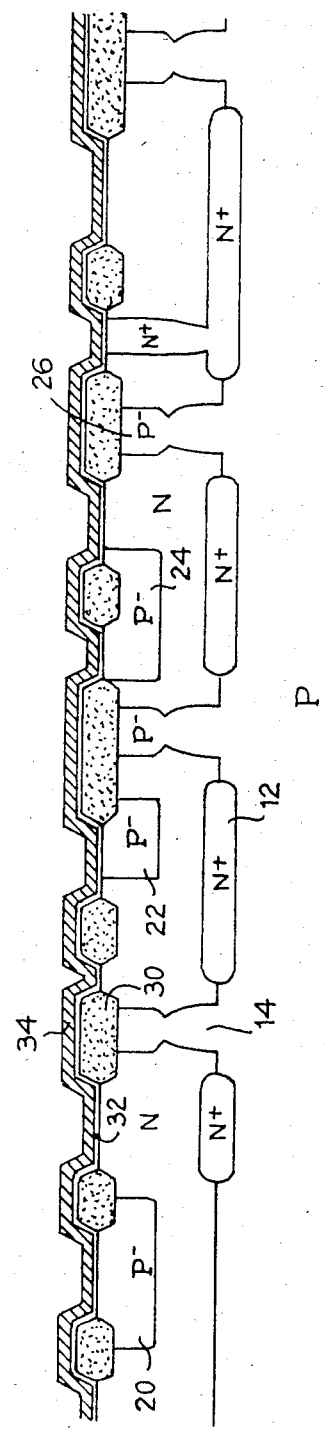

A uniform layer 34 of polycrystalline silicon having a depth of a few thousand angstroms (as shown in FIG. 6) is then uniformly deposited by chemical decomposition in gas phase and at low pressure (starting from silane).

This layer is doped either in situ (during deposition) or after deposition by diffusion of phosphorus, for example (pre-deposition of POCl₃) in order to obtain sufficient conductivity of the polycrystalline silicon.

Etching of the polycrystalline silicon and of the thin oxide is then carried out, for example by means of a plasma of CF₄ and a resin mask in order to define on the one hand the gates of the different low-voltage and high-voltage MOS transistors and on the other hand a certain number of polycrystalline interconnections as may be required.

Figure 7:
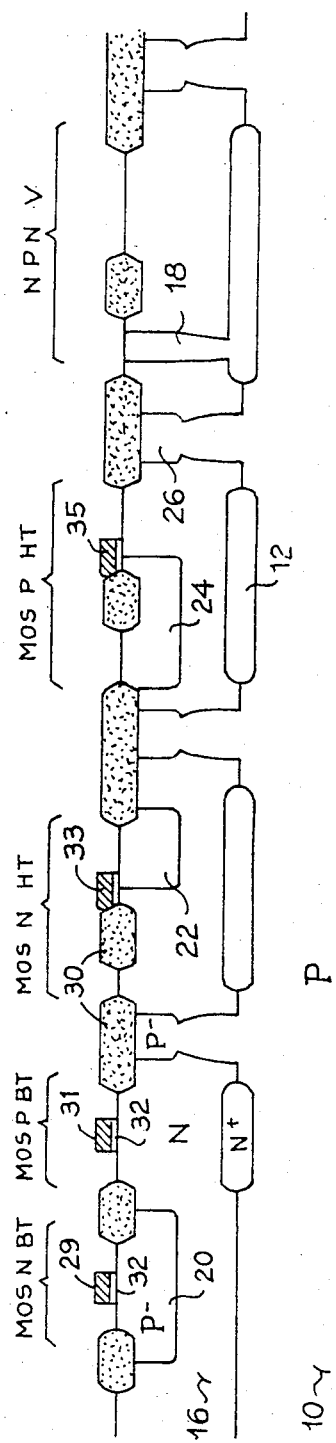

FIG. 7 illustrates the integrated structure at this stage of the fabrication process after removal of the resin mask.

In the case of n-channel low-voltage MOS transistors, the gate 29 which rests on thin oxide penetrates inside the surface of a p⁻ type compartment 20 and permits the formation of a source zone and of a drain zone within said compartment on each side of the gate. In the case of the p-channel low-voltage MOS transistors, the gate 31 passes outside a p⁻ type region and permits the formation of a source zone and of a drain zone on each side of the gate outside a p⁻ type region. In the case of the n-channel high-voltage MOS transistors, the gate 33 passes to a position astride the boundary between a p⁻ type region 22 and the epitaxial layer and permits the formation of a source zone within said region 22 on one side of the gate, of a drain zone outside said region 22 on the other side of said gate, and of a channel zone within the region 22 beneath said gate. Finally, in the case of the p-channel high-voltage MOS transistors, the gate 35 passes to a position astride the boundary between the epitaxial layer and a p⁻ type region 24 and permits the formation of a source zone within the epitaxial layer outside said region 24 on one side of the gate, of a drain zone within the region 24 on the other side of the gate, and of a channel zone within the epitaxial layer outside the region 24 beneath said gate.

The polycrystalline silicon which remains then serves as a self-alignment mask for the following ion implantation steps.

The first step consists of implantation of high-concentration p-type impurities. This implantation is intended to form p⁺ type source and drain regions of the p-channel MOS transistors as well as the base regions of npn bipolar transistors if so required. To this end, a resin layer is deposited and etched so as to mask the zones which are not intended to undergo p⁺ type implantation, namely all of the high-voltage or low-voltage n-channel MOS transistors and the access well 18 of the collectors of the npn transistors. In the case of the p-channel MOS transistors which are not masked by the resin, the thick oxide regions and the polycrystalline silicon gates serve as a mask for providing accurate definition of the p⁺ type implanted regions. Implantation is carried out with boron, for example.

Figure 8:
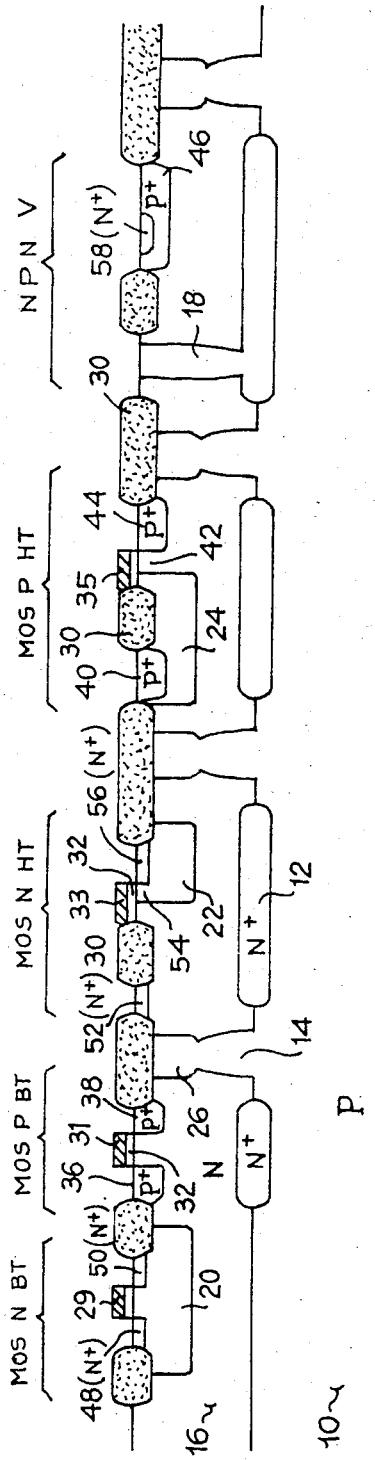
FIG. 8 is a transverse sectional view illustrating the structure of one exemplified embodiment of an integrated circuit in accordance with the invention prior to positioning of surface metal interconnections.

As shown in FIG. 8, these p+ type regions are respectively as follows:

regions 36 which constitute the drains of p-channel low-voltage MOS transistors and are implanted directly in the n-type epitaxial layer 16 between a gate 31 and a thick oxide region 30;

regions 38 which constitute the sources of said transistors and are also implanted in the n-type epitaxial layer between a gate 31 and the thick oxide region 30;

regions 40 constituting the drains of p-channel high-voltage MOS transistors. These regions 40 are implanted within p− type regions 24 and are of smaller depth than these latter. It will further be noted that the edge of the region 40 (on the channel side) is located at a relatively substantial distance from the channel region 42 proper, this distance being nevertheless shorter than the depth of the region 24. The channel region 42 just mentioned is an n-type region which is covered by the transistor gate or more precisely by the portion of gate which is separated from the semiconducting surface only by a thin oxide layer 32 and which can therefore directly control the formation of a channel;

regions 44 which constitute the sources of p-channel high-voltage MOS transistors and are implanted in the epitaxial layer between the gate 35 and a thick oxide zone;

if necessary, regions 46 which constitute the bases of the npn bipolar transistors.

The masking resin employed during p+ type implantation is then removed and an annealing operation is performed. Another layer of resin is deposited and etched for subsequent n+ type implantation (or diffusion). This resin layer masks the transistors which are not intended to undergo this implantation, namely the p-channel (low-voltage or high-voltage) MOS transistors and the base regions of the npn transistors. In the case of the unmasked transistors, the thick oxide 30 and the polycrystalline silicon regions serve as a mask for accurately defining the n+ type implanted regions. Implantation can be carried out with arsenic; a diffusion of arsenic in an ampoule is also possible.

As shown in FIG. 8, these n+ type regions are of smaller depth than the p+ type regions and are respectively as follows:

drain regions 48 of the n-channel low-voltage MOS transistors, implanted in the p− type region 20 between a gate 29 and a thick oxide zone;

source regions 50 of said transistors, also implanted in the region 20 between a gate 29 and a thick oxide zone;

drain regions 52 of n-channel high-voltage MOS transistors, implanted directly in the original n-type epitaxial layer. These regions are spaced at a distance (which is relatively substantial but of smaller value than the thickness of the epitaxial layer) from the channel region 54 proper of said transistors, that is to say the p− type region which is directly covered (through the thin oxide 32) by a gate 33 of polycrystalline silicon. Over this distance, the epitaxial layer is surmounted by a thick oxide zone 30. Under these conditions, the regions 52 are entirely defined by thick oxide 30;

regions 56 diffused into the regions 22 and constituting the source regions of n-channel high-voltage MOS transistors, the space between the edge of a region 56 and the edge of the region 22 in which it is located being such as to constitute the channel region 54 of these transistors. The regions 56 are defined by the gates 33 and thick oxide zones 30;

if necessary, regions 58 constituting the emitters of vertical npn bipolar transistors, these regions being diffused into base regions 46. The well 18 providing access to the buried layer can also be subjected to this shallow n+ type implantation operation.

The fabrication process is completed by conventional steps which are not illustrated in the drawings and consist of gas-phase deposition of a silicon oxide insulating layer, flow-processing of said layer, etching for opening contacts, deposition of metal (aluminum), etching of the aluminum so as to define an interconnection pattern, deposition of a passivating insulating layer, etching of contact pads for connecting to the pins of the package, and encapsulation.

In the example of construction described in the foregoing, the p− type compartments 20 containing the n-channel low-voltage MOS transistors are separated from the substrate by a thickness of n-type epitaxial layer. However, it could be envisaged that a p-type zone 14 has been diffused prior to epitaxial growth at the compartment location, with the result that this zone subsequently extends upwards to the compartment which in that case constitutes both a low-voltage NMOS compartment and an isolating wall. It is possible by connecting the compartment to the substrate in this manner to prevent the appearance of a so-called latch-up phenomenon or in other words the formation of a parasitic npnp thyristor.

The method which has been described in the foregoing is wholly compatible with the formation of lateral pnp bipolar transistors (emitter and collector formed at the same time as the drain of the p-channel MOS transistors, the base being formed by the epitaxial layer).

Finally, if the starting substrate is n+ type, consideration can be given to the fabrication of a power element which would be designated as a vertical DMOS, that is to say a diffused n-channel MOS transistor in which the drain is constituted by the n+ rear face of the substrate, in which the source is constituted by n+ zones as is the case with the sources of low-voltage n-channel MOS transistors, and in which the channel region is diffused locally with the p− type compartment diffusion of the low-voltage n-channel MOS transistors.

What is claimed is:

1. An integrated circuit structure incorporating low-voltage n-channel and p-channel MOS transistors and high-voltage n-channel and p-channel MOS transistors, comprising a semiconductor wafer formed by a substrate covered with a lightly doped n-type epitaxial layer;

first lightly doped p− type regions extending from the surface of the semiconductor wafer to part of the depth of the epitaxial layer, these regions being such as to constitute compartments in which are formed the source, the drain and the channel of low-voltage n-channel MOS transistors;

heavily doped p+ type regions which are of smaller depth than the p− type regions, which extend from the surface of the semiconductor wafer, and which constitute the source and the drain of the p-channel MOS transistors;

heavily doped n+ type regions which are of smaller depth than the p− type regions, which extend from the surface of the semiconductor wafer, and which constitute the source and the drain of the n-channel MOS transistors; wherein provision is also made for:

at least a second p⁻ type region having the same concentration profile as the first regions and extending to the same depth, said second region being adapted to surround an n+ type source region and to constitute a channel region of a high-voltage n-channel MOS transistor which further comprises an n+ type drain region located outside the second region and in spaced relation thereto so as to permit the existence of a lightly doped n-type epitaxial layer zone not directly controlled by the transistor gate between said drain region and said second region;

at least a third p⁻ type region having the same concentration profile as the first and second regions and extending to the same depth, said third region being adapted to surround a p+ type drain region of a high-voltage p-channel MOS transistor in which the channel region is constituted by a lightly doped n-type epitaxial layer region adjacent to the third region, the p+ type drain region of said transistor being in spaced relation to the channel region so as to form between these latter a zone of the third region which is not directly controlled by the transistor gate, and the source region of said transistor being located outside said third region.

2. A structure according to claim 1, wherein said structure comprises p-type isolating walls which pass right through the epitaxial layer from top to bottom, the upper portions of said walls being constituted by p⁻ type regions formed by the same operation as the first, second and third regions.

* * * * *